United States Patent [19]

Miyanaga et al.

[11] Patent Number: 5,397,558
[45] Date of Patent: Mar. 14, 1995

[54] METHOD OF FORMING DIAMOND OR DIAMOND CONTAINING CARBON FILM

[75] Inventors: Akiharu Miyanaga; Masaya Kadono, both of Kanagawa; Shunpei Yamazaki, Tokyo, all of Japan

[73] Assignee: Semiconductor Energy Laboratory Co., Ltd., Kanagawa, Japan

[21] Appl. No.: 93,973

[22] Filed: Jul. 2, 1993

Related U.S. Application Data

[63] Continuation of Ser. No. 857,259, Mar. 25, 1992, abandoned.

[30] Foreign Application Priority Data

| Mar. 26, 1991 | [JP] | Japan | 3-087781 |
| Mar. 27, 1991 | [JP] | Japan | 3-087777 |
| Mar. 27, 1991 | [JP] | Japan | 3-087779 |

[51] Int. Cl.$^6$ .................... C30B 29/04; C01B 31/04
[52] U.S. Cl. .................. 423/446; 427/249; 427/255.1
[58] Field of Search ............... 423/446; 427/249, 577, 427/255.1; 156/DIG. 68; 204/157.43, 157.47

[56] References Cited

U.S. PATENT DOCUMENTS

| 4,816,286 | 3/1989 | Hirose | 423/446 |
| 4,915,977 | 4/1990 | Okamoto et al. | 423/446 |
| 5,015,528 | 5/1991 | Dinneo | 423/446 |

FOREIGN PATENT DOCUMENTS

| 103367 | 5/1987 | Japan . |
| 2223096 | 10/1987 | Japan | 423/446 |
| 123895 | 5/1988 | Japan . |

OTHER PUBLICATIONS

Translation of JP 62-103367 May 13, 1987.

*Primary Examiner*—Michael Lewis
*Assistant Examiner*—Stephen G. Kalinchak
*Attorney, Agent, or Firm*—Sixbey, Friedman, Leedom & Ferguson; Gerald J. Ferguson, Jr., Jeffrey L. Costellia

[57] ABSTRACT

A CVD method for forming a diamond or diamond containing carbon film comprises the step of inputting a reactive gas, supplying energy to the reactive gas, and depositing the carbon film on a substrate. The reactive gas includes a carbon compound material which has a diamond structure in its molecular structure. The representative material is adamantane. Oxygen or hydroxyl group is also added in order to improve the crystallinity of the deposited carbon film.

16 Claims, 10 Drawing Sheets

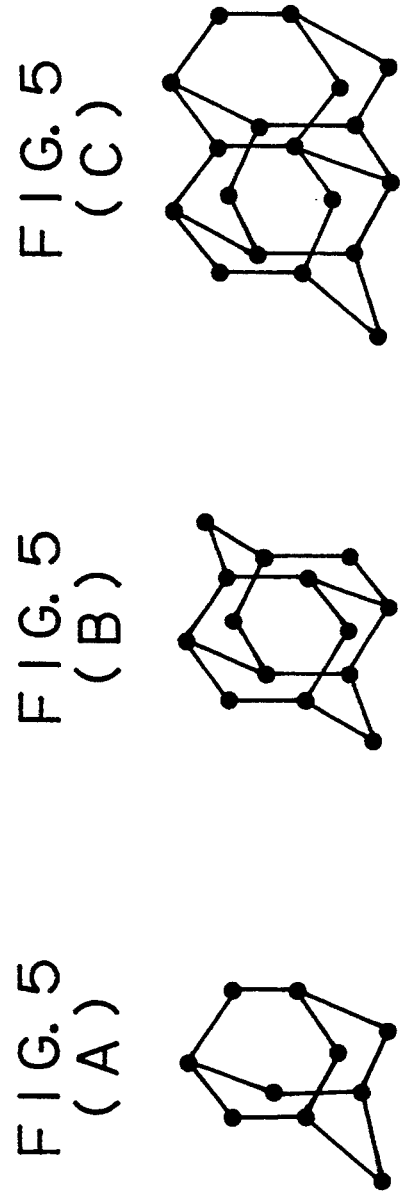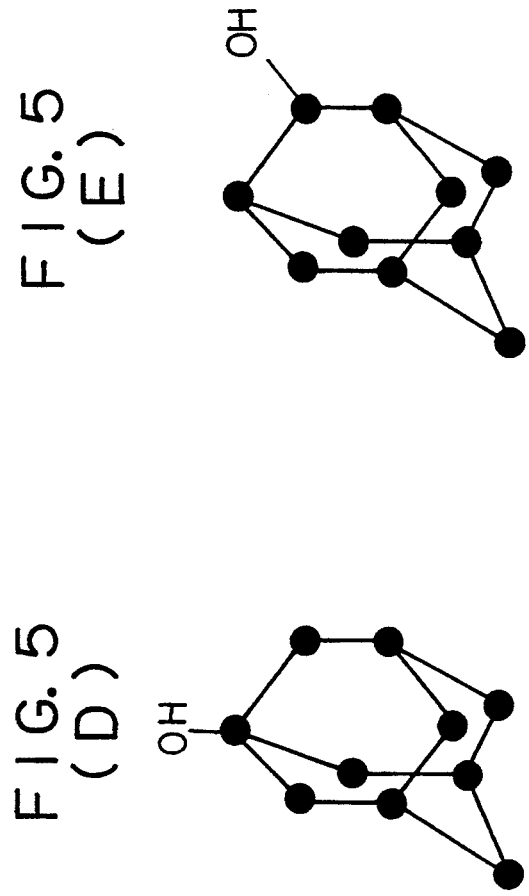

F I G. 17
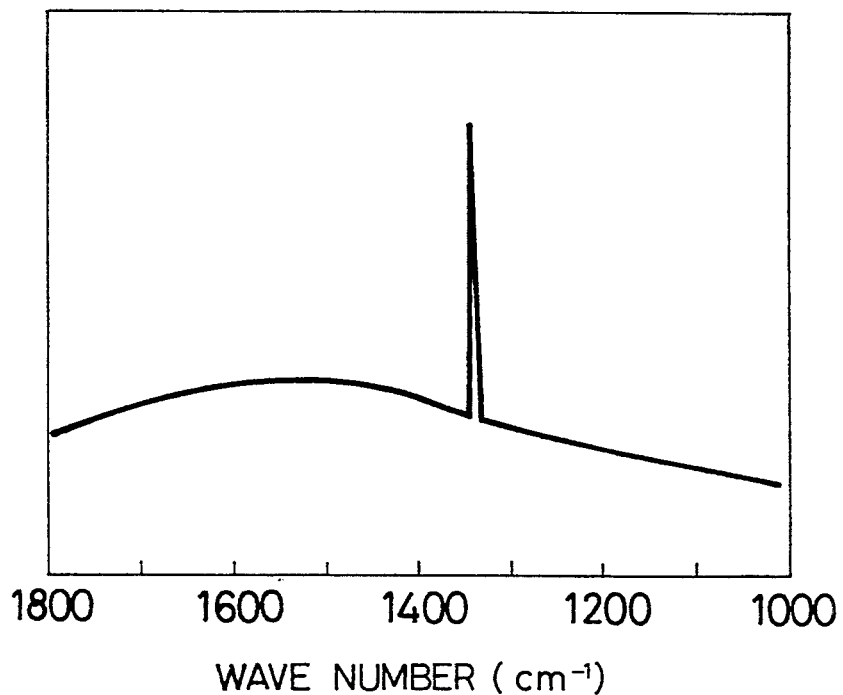
F I G. 18
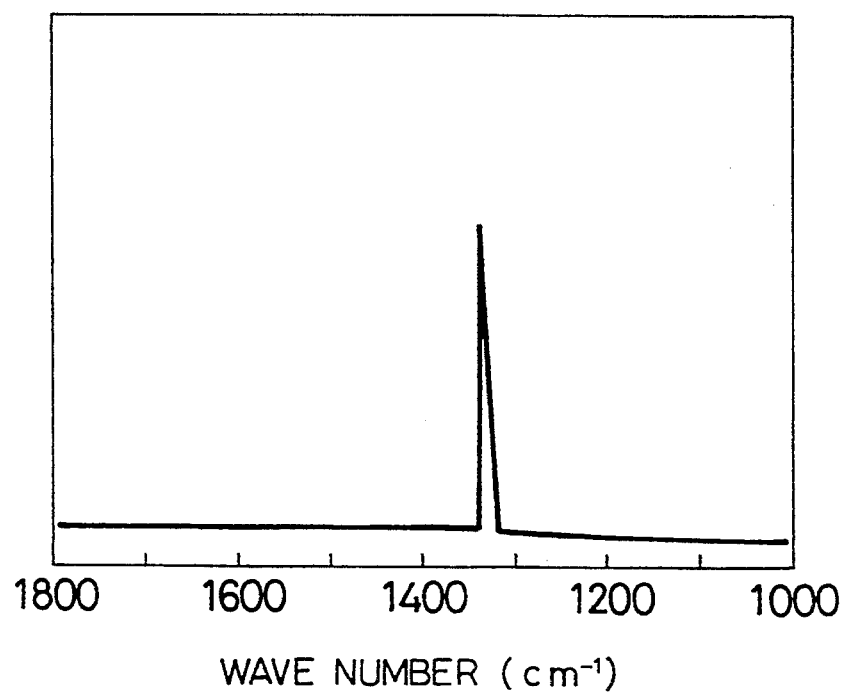

METHOD OF FORMING DIAMOND OR DIAMOND CONTAINING CARBON FILM

This application is a continuation of Ser. No. 07/857,259, filed Mar. 25, 1992, now abandoned.

BACKGROUND OF THE INVENTION

1. Field of the Invention

The present invention relates to a method of forming a diamond or diamond containing carbon film, under a lower pressure region. More specifically the present invention is directed to a particular selection of reactive gases for forming the carbon layer by CVD method, and further relates to an improvement of an introducing method of reactive gases into CVD apparatuses.

2. Description of the Prior Art

Up to the present time, as a method of forming a diamond film or a diamond containing carbon film, a thermal CVD (Chemical Vapor Deposition) method has been most frequently utilized. This is a method, as shown for example in FIG. 1, to form a diamond film or a diamond containing carbon film on a substrate, by causing a reactive gas introduced into a quartz reaction vessel 1 through a gas inlet 2 and outlet 5 to chemically react on the substrate 4, which is heated at 400°–1300° C. by releasing thermoelectrons from a metallic tungsten or tantalum filament S heated by electric current at 1500°–3000° C. At this time, the pressure in the reaction vessel is kept at 1–350 Torr. Therefore, it is cheap and easy to handle the thermal CVD method.

As another method of forming a diamond film or a diamond containing carbon film, it has been known to use a microwave plasma CVD method. This is, as shown for example in FIG. 2, to introduce a reactive gas through an upper part of a quartz reaction tube 1 which is inserted into one part of a microwave guide 6, and to effect a vacuum exhausting through a lower portion of the quartz reaction tube. In this method, the microwave having 2.45 GHz frequency is regularly employed, and the pressure in the reaction tube is kept at 10–200 Torr.

Further, it has been known for forming a diamond film or a diamond containing carbon film to use a mutual action between microwave and magnetic field. There are two ways in this type of the CVD methods, one is called a magnetic field-microwave plasma CVD method utilizing MCR (Mixed Cyclotron Resonance) which occurs when the pressure is 0.1 Torr or higher as disclosed in U.S. Pat. No. 5,015,494, having Ser. No. 329,877 issued to Yamazaki, and the other is the ECR plasma method using ECR (Electron Cyclotron Resonance), the phenomenon arising in case of such very low reaction pressure as less than 0.1 Torr.

FIG. 3 shows a schematic diagram of an apparatus used for the magnetic field-microwave plasma CVD applying MCR, in which a reactive gas introduced into a reaction chamber through a gas inlet 2 will be effectively excited by using a mutual action between a magnetic field induced by a electromagnetic coil 7 and a microwave introduced into the reaction chamber from a microwave guide 8, resulting in that a diamond film or a diamond containing carbon film will be formed on a substrate 4. The substrate is under the control of temperature, by heating the substrate holder, and also it is possible to add a floating field 8 to the substrate. Such a CVD method as explained above, has a drawback that it is inevitably inefficient to form a large area film, and the film-formation is at most limited to $\phi$100 mm substrate, being caused by the mass and the operational nature of the reaction chamber.

On the other hand, the shape of an ECR plasma CVD apparatus is almost the same as the above stated magnetic field-microwave plasma CVD apparatus. But according to the ECR plasma apparatus, the plasma can spread more as compared with the magnetic field-microwave CVD apparatus, arising from such a very low reaction pressure as less than 0.1 Torr, thus making it possible to form a film on a larger substrate. For this reason, almost all of the ECR plasma CVD apparatuses are a type of the "Deposition-Down" as illustrated in FIG. 4. In general, a reactive gas is inputted to the apparatus through a gas inlet 2. Alternatively, a dilution gas is inputted through the gas inlet 2, and to input a raw material gas through a gas inlet 9 or 10. By the ECR plasma CVD method, only the carbon film containing less proportion of diamond can be formed. Still the diamond film can not be formed.

Further, in case where a mixed gas of a raw material gas and a dilution gas is introduced through the gas inlet 2, it is impossible to provide a sufficient amount of active particles containing carbon around the substrate, since the active particles happen to recombine before they reach to the substrate, the result being that the deposition rate will be inferior to that of the magnetic field-microwave plasma CVD method. Also in case where a raw material gas is inputted through the gas inlet 9 and a dilution gas is inputted through the gas inlet 2, it is impossible to supply the substrate with sufficient raw material gas, as a boundary will be made at the verge of the spread plasma.

Still further, in case where a raw material gas through gas inlet 10 and a dilution gas through gas inlet 2 are inputted respectively, while it can be attained that the deposition rate is maintained at 0.3 $\mu$m/hour which is regarded as the maximum value by ECR plasma CVD method, the uniformity of the formed film is not very good, for example, there exists a portion in the film at which the thickness thereof is only 30% of the maximum thickness thereof. We understand this is because the plasma is interrupted by the gas introducing conduit.

As a gas utilized in the formation, a raw material which is in a gas phase or a liquid phase at normal temperature and pressure (i.e. room temperature and atmospheric pressure) is utilized. The raw material which is gaseous at normal temperature and pressure has an advantage that it is easy to control its flowing amount. For instance, methane, ethylene, carbon monoxide, acetylene, hydrogen, carbon dioxide, and argon are used. On the other hand, as to the raw material which is in liquid state at normal temperature and pressure, there are two kinds of gases which are usable or not, depending upon their vapor pressure curve and upon a reaction pressure during the formation. For example, methanol, ethanol, acetone, and water are utilized as a liquid raw material for forming diamond.

In general, the deposition rate is not higher than 1 $\mu$m/hour in the case of the magnetic field-microwave plasma CVD method using the MCR, and not higher than 0.3 $\mu$m/hour in the case of the ECR CVD method.

SUMMARY OF THE INVENTION

Accordingly, it is an object of the present invention to provide a novel method of forming a diamond film or a diamond containing carbon film with a high deposition rate and a high uniformity.

It is further object of the present invention to provide a novel method of forming a diamond film at lower temperatures on a material such as a metal having a low melting point which is easily damaged by heat.

In order to achieve the above objects, considerations have been made by the present inventors with respect to reactive gases for the formation of diamond, and have found that the film formation rate and the quality of the film can be improved by utilizing a gas made of a material having the same molecular structure as the diamond, i.e. the stereostructure with $SP^3$ hybridized orbital.

In accordance with the present invention, for that purpose, such organic compounds having a diamond structure in their molecular constitution as adamantane, diamantane, and triamantane, the constitutional formulae of which are indicated in FIGS. 5A–C are used. Further in accordance with the present invention, such organic compounds having both diamond structure and OH radical in their molecular constitution as 1-adamantanol, and 2-adamantanol, the constitutional formulae of which are shown in FIGS. 5D and 5E, are used. In this case, the deposition rate can be still more improved.

The adamantane is a condensation product of alicyclic hydrocarbon which is represented as $C_{10}H_{16}$, and has a cage-form structure obtained by the condensation of chair-form cyclohexane rings. It has 268° C. of melting point and is stable at normal temperature and pressure. But it is convenient to get adamantane vapor, since it begins to sublimate at normal temperature under reduced pressure. That is, the adamantane gas can be prepared, by putting a solid adamantane in a container and reducing the pressure in the container to effect sublimation of adamantane.

At this time, it is required to previously cool the adamantane in a container with a liquid nitrogen, so as to prevent atmospheric gas from being contaminated in the adamantane gas. This comes from the fact that the cooling causes the vapor pressure of adamantane to be reduced so that adamantane does not sublimate, thus making it possible to exhaust in advance only the atmospheric gas contained in the container. Then, the pure adamantane gas can be prepared, by putting the temperature back to before the cooling or by further heating the container.

The basic frame of adamantane belongs to the cage type, which can be seen in the minimum unit of diamond. Adamantane molecules will combine each other to form a diamond structure, as it has a $SP^3$ hybridized orbital. Namely, adamantane or adamantane compounds have a diamond structure in their molecular constitution, and also it is considered that these have a structure which plays an important part in the process of homoepitaxial growth on the crystal face (111) of diamond.

Further, in accordance with the present invention, the method of gas introduction has been improved in order to make the film formation more uniform. FIG. 8 indicates a schematic diagram of an apparatus used in the formation of diamond or diamond containing carbon. It has no remarkable difference in an external appearance compared with conventional ECR plasma CVD apparatus, however, it is different in the way of gas introduction from the conventional apparatus. The gas containing hydrogen atom, oxygen atom or both of them will be introduced into a plasma generating chamber 21 kept at a reduced pressure through a gas inlet 2, and a magnetic field and a microwave power will be applied from outside to the gas, to generate a high density plasma by mutual action of the magnetic field and the microwave. Then, the excited ion particles and activated particles in the gas containing hydrogen, oxygen or both of them will be directed to a substrate surface held in a reaction chamber. And also a film-forming gas containing carbon will be inputted through the gas inlet 11 located under part of the center of a substrate holder which is being rotated, thereby forming a diamond film or a diamond containing carbon film on the above substrate surface.

In this way, it is possible to introduce the raw material gas containing carbon around the substrate without an interruption of plasma with a gas inlet pipe. But it is needed to think out some idea so as to form a film on the large area, as the arrangement of the substrate is changed. FIG. 7 is a top plan view of the substrate holder. The processed area of each substrate 4 is small, however, the total processed area is enough large. In other words, there is no problem about the area, since a lot of substrates can be processed at one time. And if each substrate is desired to be made large, it can be attained by preparing a large reaction chamber and plasma generating chamber in accordance with the size of the substrate.

At lower temperatures, the deposition rate of a diamond containing carbon tends to increase while that of a diamond tends to decrease. Like this, the formation depends upon the formation temperatures so that the temperature of the substrate is controlled up to 1000° C. in order to maximize the formation.

BRIEF DESCRIPTION OF THE DRAWING

The objects, features and advantages of the present invention will become more apparent from the following description of the preferred embodiments taken in conjunction with the accompanying drawings, in which:

FIGS. 5 is a diagram showing the constitutional formulae of (A) adamantane, (B) diamantane, (C) triamantane, (D) 1-adamantanol, and (E) 2-adamantanol;

FIG. 17 is a Raman spectrum graph of the diamond film formed by microwave plasma CVD method using adamantane in Example 8 of the present invention; and FIG. 18 is a Raman spectrum graph of the diamond film formed by microwave plasma CVD method using adamantane in Example 9 of the present invention.

DETAILED DESCRIPTION OF THE PREFERRED EMBODIMENTS

Figure 1:
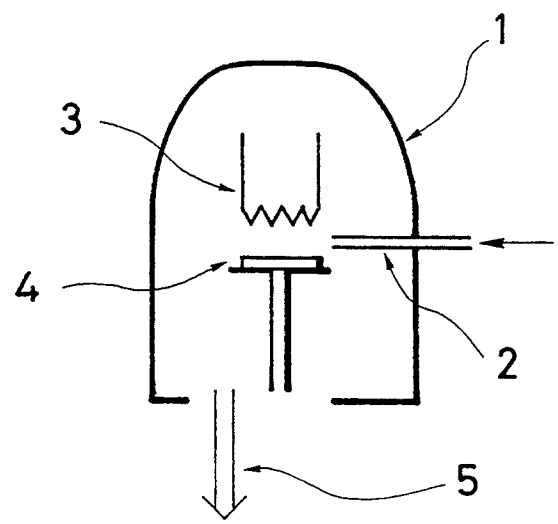
FIG. 1 is a schematic diagram of a heat-filament CVD apparatus of prior art.
Figure 2:
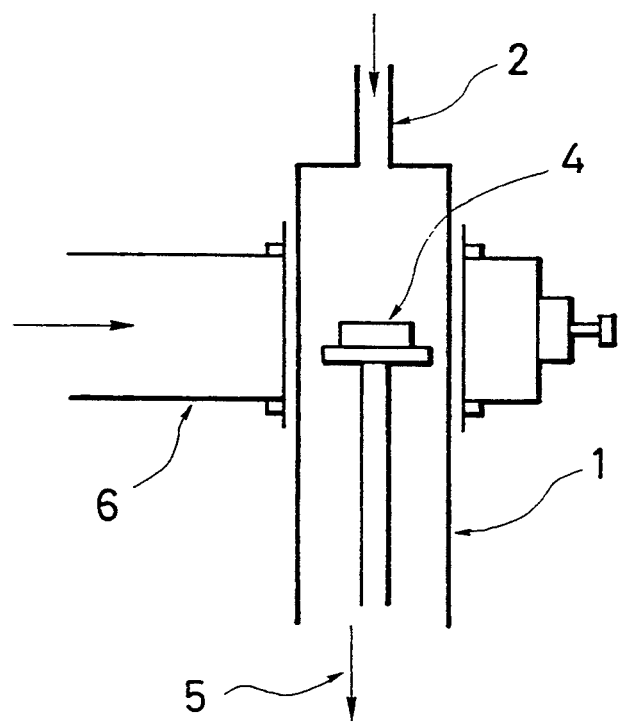
FIG. 2 is a schematic diagram of a microwave plasma CVD apparatus of prior art.
Figure 3:
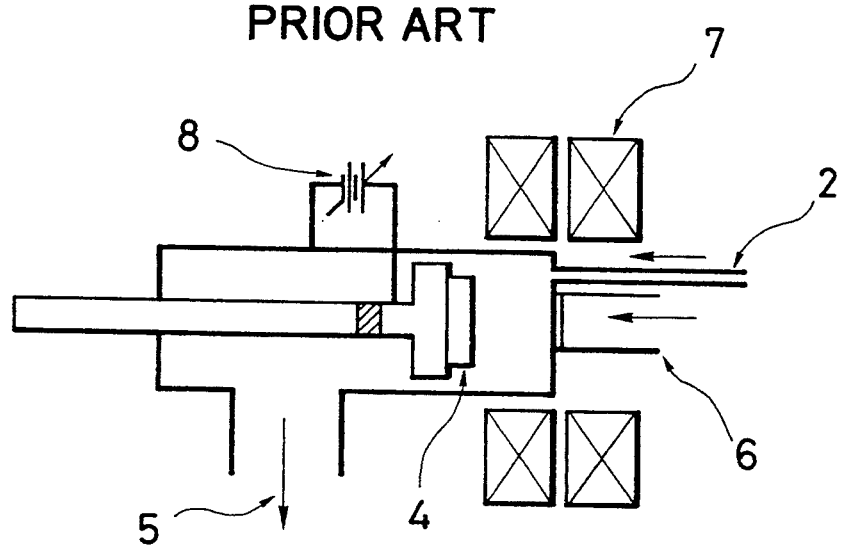
FIG. 3 is a schematic diagram of a magnetic field-microwave CVD of prior art.
Figure 4:
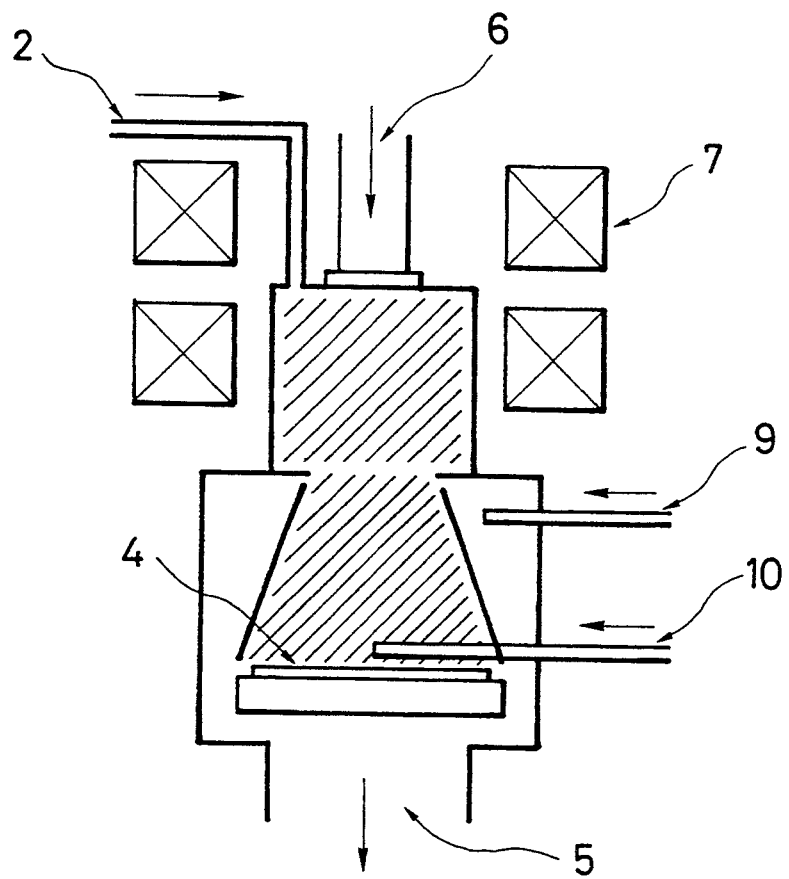
FIG. 4 is a schematic diagram of an ECR plasma CVD apparatus of prior art.
Figure 6:
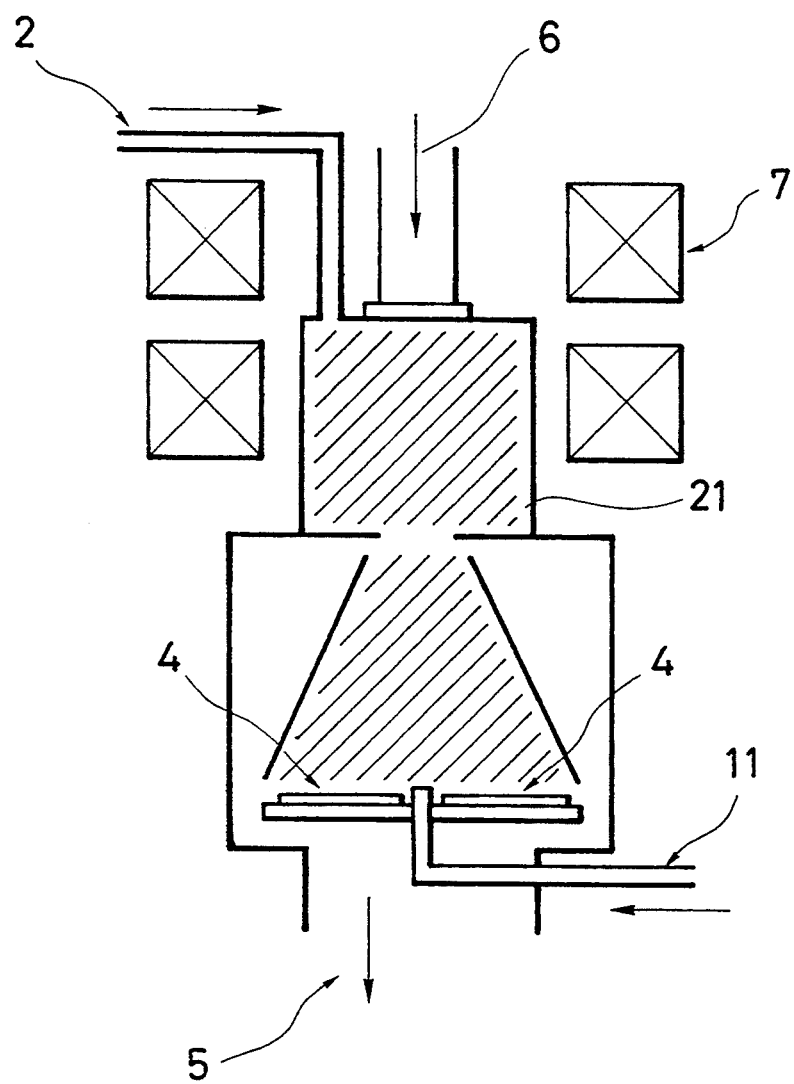
FIG. 6 is a schematic diagram of a plasma CVD apparatus utilized in the present invention.

The present invention will be explained in more detail by reference to the following examples in connection with the drawings. In Examples 1-6, the plasma CVD apparatus applying microwave and magnetic field which is shown in FIG. 6 was used.

[EXAMPLE 1]

Figure 7:
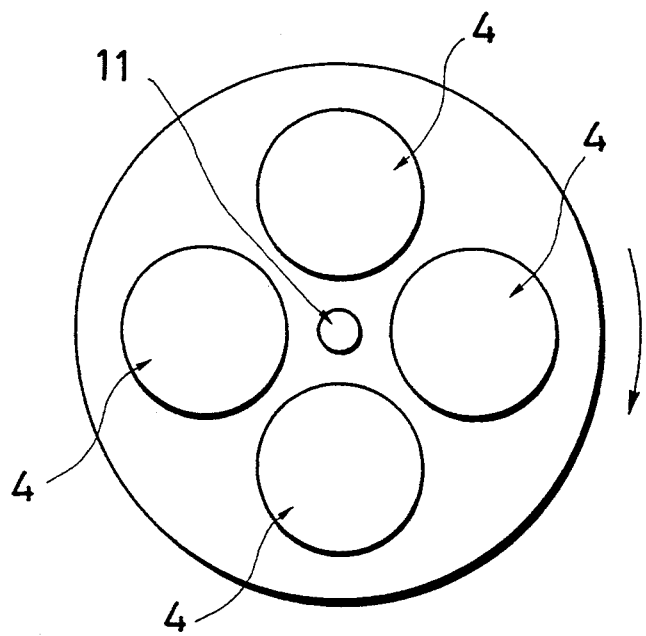
FIG. 7 is a top perspective view outlining the substrate holder utilized in Example 1 of the present invention.

The film formation condition of this experiment is shown below. As shown in FIG. 7, four silicon wafers 4 having a diameter 100 mm were placed on the substrate support. In this example, a raw material gas of adamantane and a dilution gas of hydrogen were utilized at a flow rate 10 sccm and 100 sccm, respectively. As set forth before, before adamantane vapor was introduced in the reaction chamber, the solid adamantane was cooled by liquid nitrogen in order to exhaust unnecessary air. Other process conditions are as follows:

| | |
|---|---|
| Pressure: | $2.0 \times 10^{-2}$ Torr |
| Substrate Temperature: | 500° C. |
| Treating Time: | 1 hour |
| Microwave (2.45 GHz) Output: | 3 kW |
| Magnetic Field: | 2 kgauss (max) |

The film-thickness was measured by the step difference between a portion which was formed with the film and a portion which was not formed with a film, which portion had been covered by a dummy Si wafer as a mask.

Figure 8:
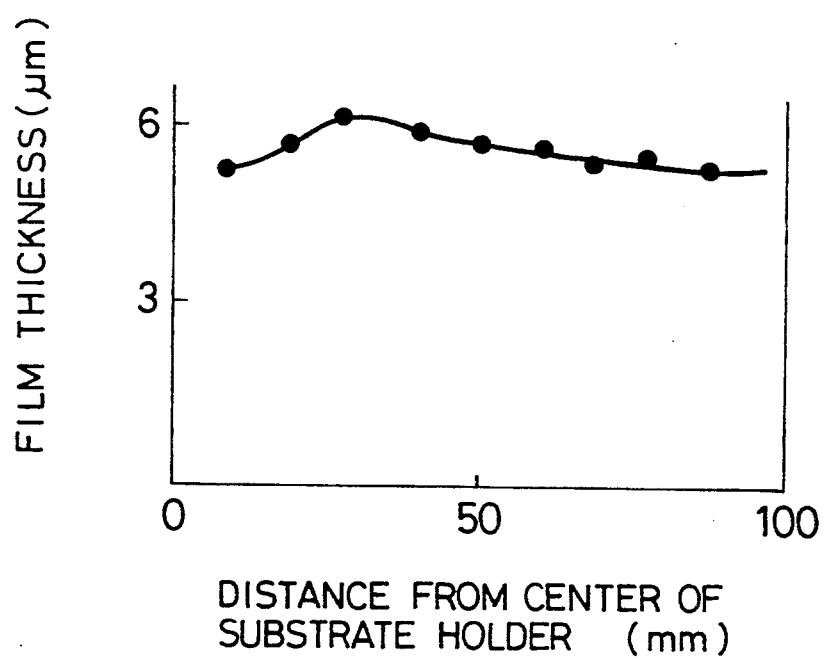
FIG. 8 is a graph showing a distribution of the film-thickness obtained in Example 1 of the present invention.

In the experiment conducted under the above conditions, the carbon film was deposited to the thickness of about 6 μm. Therefore, the deposition rate was about 6 μm. The assessment of a film-thickness uniformity i.e. the distribution of film-thickness formed on the ϕ100 mm Si wafer is indicated in FIG. 8. It can be said that the film has a good uniformity, as even the thinnest part has more than 90% of the maximum film-thickness, though the film nearby the raw material gas inlet is relatively thick.

Figure 9:
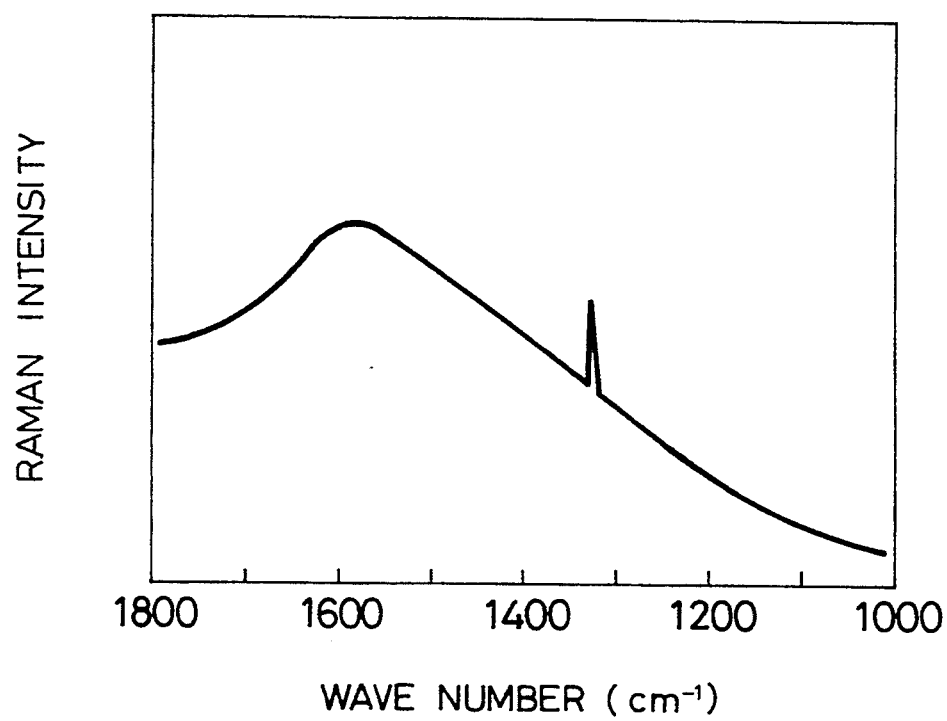
FIG. 9 is a Raman spectrum graph of the diamond film formed by using adamantane in Example 1 of the present invention.

The film quality was evaluated by Raman spectroscopy to examine the crystal structure of the formed film. The result obtained by Raman spectroscopy on the film quality of the formed film at the center part of ϕ100 mm Si wafer was shown in FIG. 9. There exists a broad peak of the amorphous carbon film, neighboring 1550 $cm^{-1}$, and a sharp peak of diamond can be confirmed at 1332 $cm^{-1}$. It is analyzed that the deposited carbon film includes a considerable lots of diamond constituents in it, taking into account that the Raman spectroscopy has a sharp sensitivity to amorphous carbon but not to diamond. Namely, it can be concluded that the diamond film was formed.

[EXAMPLE 2]

The formation condition in this experiment is as follows. The same substrates with those of Example 1 was used, As a raw material gas, 10 sccm of diamantane, and as a dilution gas, 100 sccm of hydrogen or hydrogen added with 25 sccm of oxygen was used. Other conditions are entirely the same with those of Example 1 so that redundant descriptions will be omitted. Film-thickness was measured by the same way as in the Example 1.

Under the above condition, the film-thickness was approximately 3 μm. Therefore, the deposition rate was 3 μm/hour. It can be said that the film has a good film uniformity, as a film-thickness distribution of the film formed on ϕ100 mm Si-wafer shows more than 90% of the maximum film-thickness at even the thinnest part.

Figure 10:
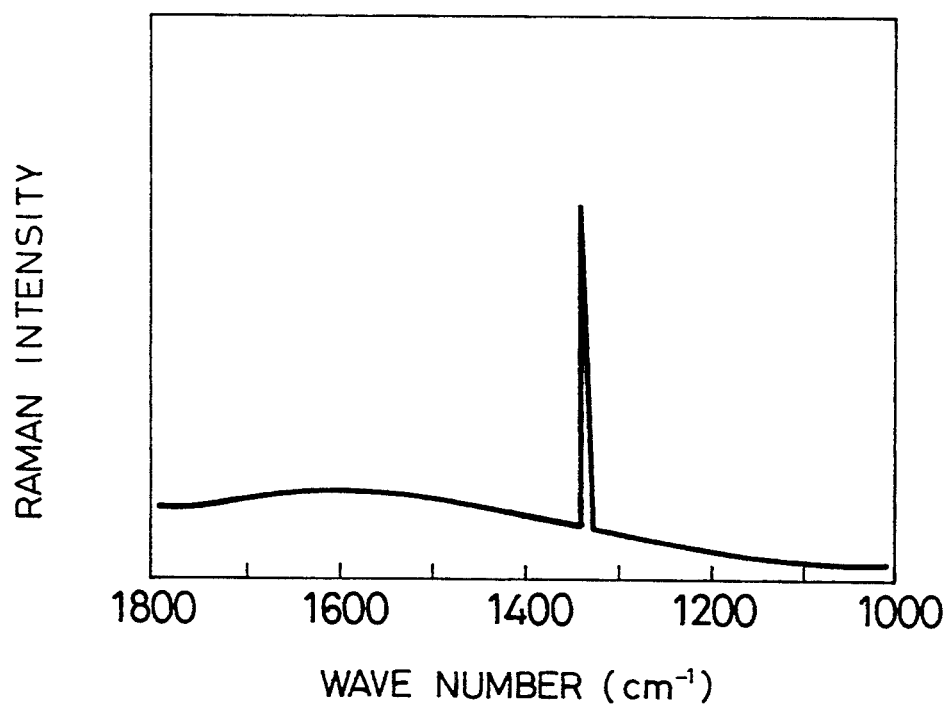
FIG. 10 is a Raman spectrum graph of the diamond film formed by co-using oxygen in Example 2 of the present invention.

The film quality was evaluated by using Raman spectroscopy, the result of which is shown in FIG. 10. A sharp peak of diamond exists at 1332 $cm^{-1}$, and a broad peak of amorphous carbon film at 1550 $cm^{-1}$ can not be found at least. Accordingly, the film formed in this experiment is the very diamond film.

It is evident from the Examples 1 and 2 that the film quality will be improved by adding oxygen to the dilution gas.

[EXAMPLE 3]

The film-forming condition in the experiment is described below. The same substrate with that of Example 1 was used. 10 sccm diamantane as a raw material gas, and 100 sccm hydrogen as a dilution gas were used. Diamantane is needed to be treated like Example 1 since it is a subliming solid as well as adamantane. The other conditions are the same as those in Example 1.

Figure 11:
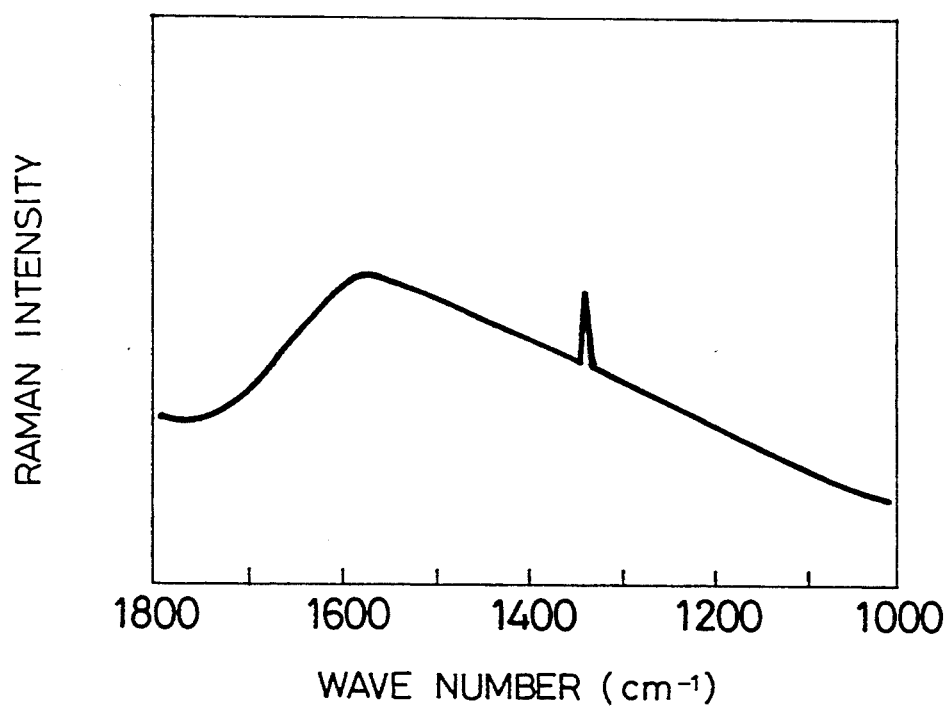
FIG. 11 is a Raman spectrum graph of the diamond film formed by using diamantane in Example 3 of the present invention.

As a result, the film-thickness was about 10 μm/hour, therefore, the deposition rate was calculated to be about 10 μm/hr. A film-thickness distribution of the film formed on ϕ100 mm Si wafer shows more than 90% of the maximum film thickness at even the thinnest part of the film, so that the film has a fine uniformity. The measurement result of film quality for the film formed at the center part of ϕ100 mm Si wafer by Raman spectroscopy is shown in FIG. 11. A broad peak of an amorphous carbon film appears near 1550 $cm^{-1}$. A sharp peak of diamond can be confirmed at 1332 $cm^{-1}$, and the film quality is almost the same as Example 1.

In accordance with the present example, it is understood that the deposition rate can be improved by changing the gas from adamantane to diamantane while the film quality is not changed.

As shown in the foregoing Examples 1-3, it was possible to enhance the formation speed of a diamond or a diamond containing carbon film to more than 10 times by the use of adamantane and diamantane.

[EXAMPLE 4]

In this example, a 1-adamantanol gas at a flow rate 20 sccm and a hydrogen gas at a flow rate 100 sccm were utilized. The formation conditions were the same as those in Example 1.

Figure 12:
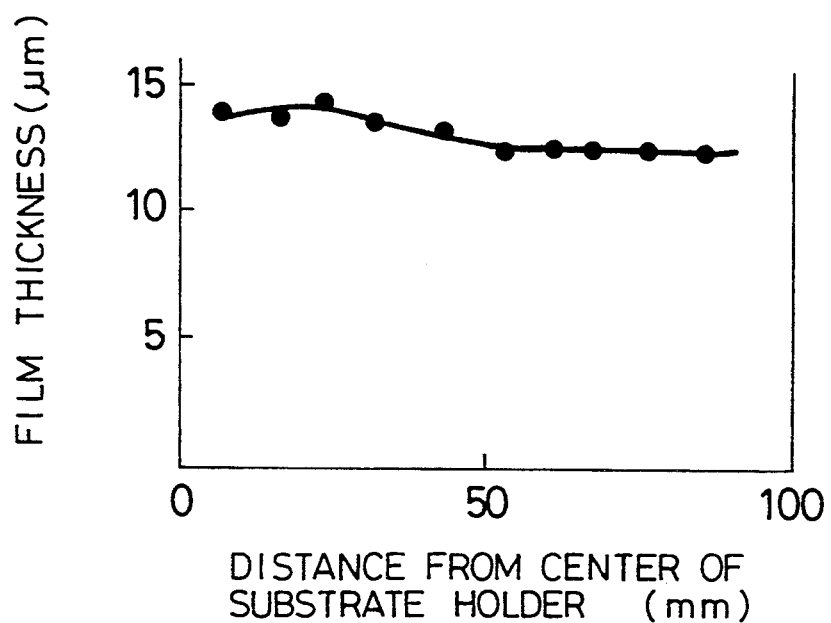
FIG. 12 is a graph showing a distribution of the film-thickness obtained in Example 4 of the present invention.

The deposition rate in this example was 14 μm/hour. FIG. 12 shows a thickness distribution of the film formed on a φ100 mm Si wafer for the evaluation of film-thickness uniformity. From FIG. 12, it is observed that the uniformity of the film was good as the film-thickness has more than 90% of the maximum thickness at even the thinnest part of the film, though it is thick nearby the gas inlet.

Figure 13:
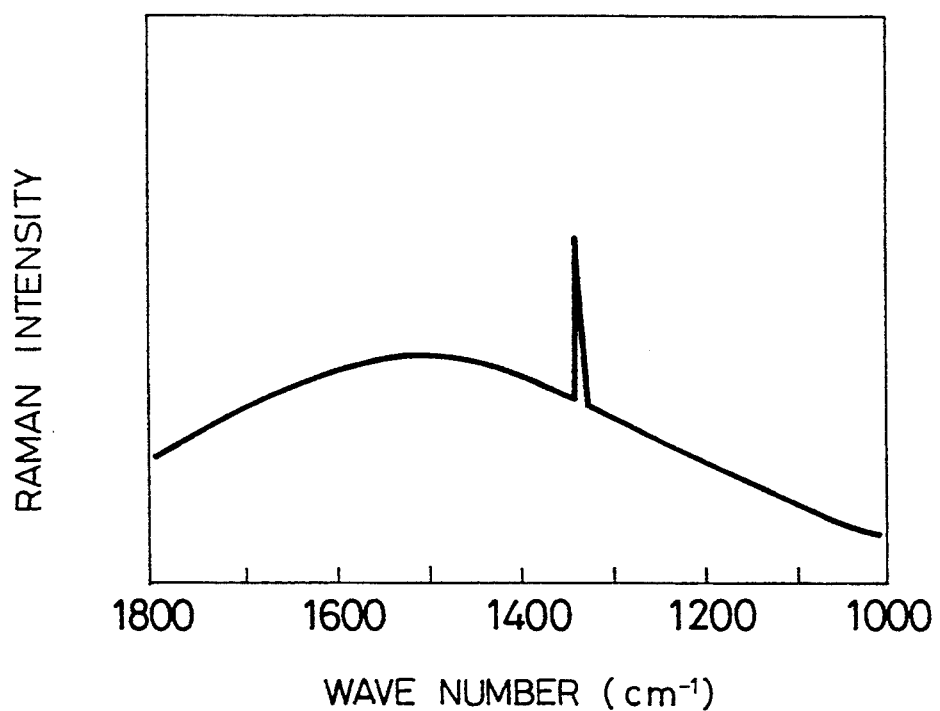
FIG. 13 is a Raman spectrum graph of the diamond film formed by using adamantane in Example 4 of the present invention.

FIG. 13 shows the result of Raman spectroscopy on the center portion of the film. A broad peak appeared near 1550 cm$^{-1}$ showing the existence of amorphous carbon, and a sharp peak appeared at 1332 cm$^{-1}$ showing the existence of diamond. It is analyzed that the deposited carbon film includes a considerable lots of diamond constituents in it, taking into account that the Raman spectroscopy has a sharp sensitivity to amorphous carbon but not to diamond. Namely, it can be regarded that the diamond film was formed.

[EXAMPLE 5]

In this example, a raw material gas of 1-adamantanol, a dilution gas of hydrogen and oxygen were utilized at a flow rate of 50 sccm, 100 sccm and 25 sccm, respectively. The other process parameters were the same as those of Example 1.

As a result, the deposition rate was 8 μm/hour. The uniformity of the film thickness was good as the thickness even at the thinnest part of the film is not less than 90% of the maximum film thickness.

Figure 14:
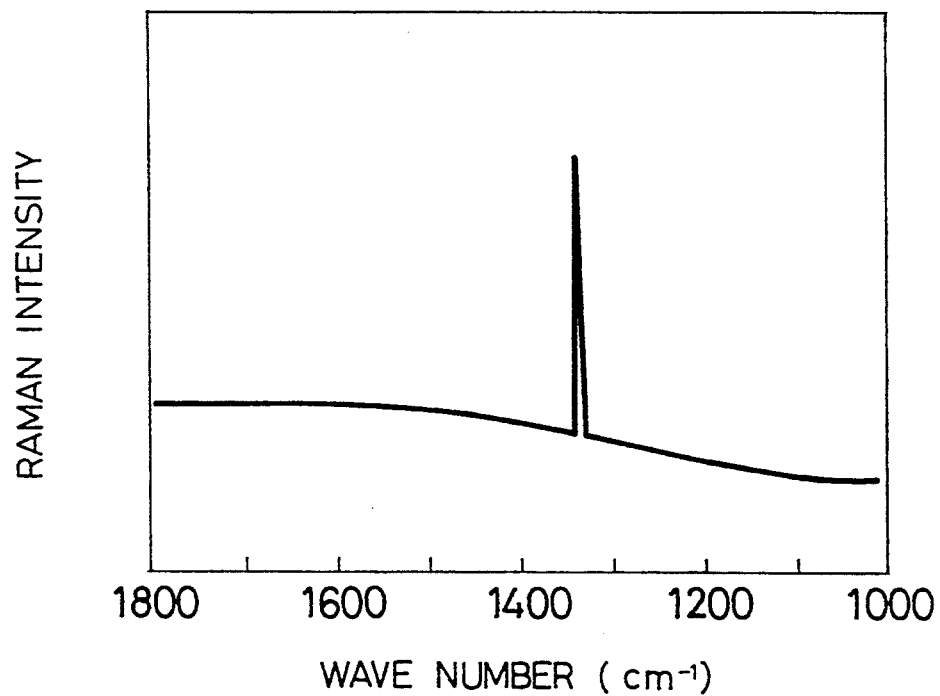
FIG. 14 is a Raman spectrum graph of the diamond film formed by mixing oxygen in Example 5 of the present invention.

FIG. 14 shows a result of a Raman spectroscopy on the center portion of the φ100 mm Si wafer. There exists a sharp peak at 1332 cm$^{-1}$ showing the existence of diamond. A broad peak is not seen around 1550 cm$^{-1}$ of amorphous carbon. Therefore, the film obtained in this example was diamond.

It is apparent from Examples 4 and 5 that while the deposition rate was decreased by the addition of oxygen, the film quality was improved.

[EXAMPLE 6]

In this example, a raw material gas of 2-adamantanol at 20 sccm and a dilution gas of hydrogen at 100 sccm were utilized. Other conditions in this example were the same as those of Example 1.

As a result, the deposition rate was 9 μm/hour. The uniformity of the film thickness .was good as the thickness even at the thinnest part of the film is not less than 90% of the maximum film thickness on the φ100 mm Si wafer.

Figure 15:
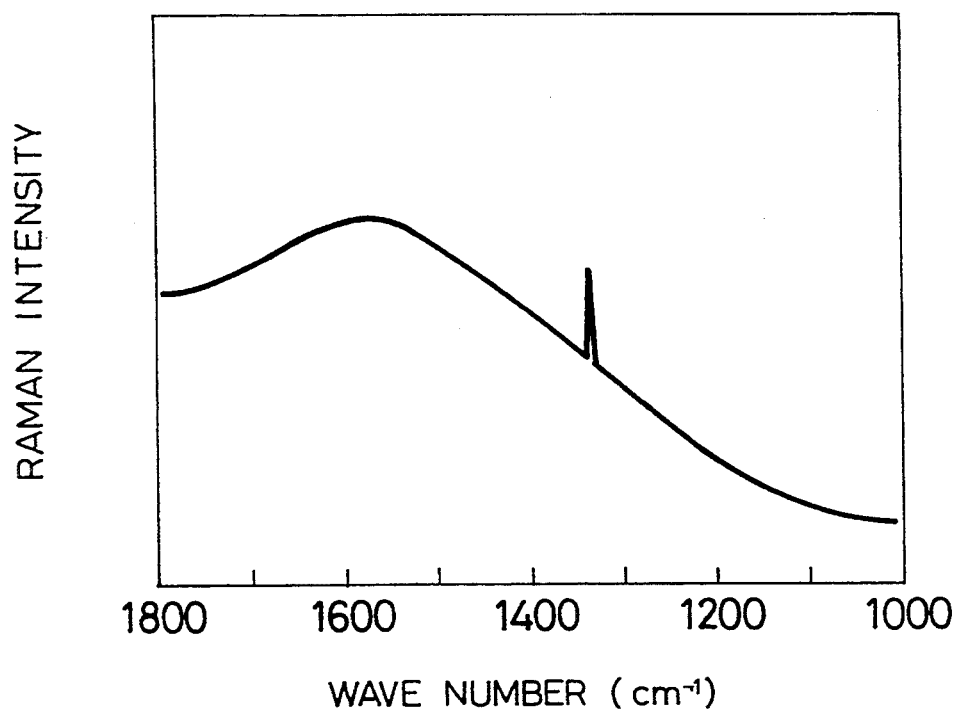
FIG. 15 is a Raman spectrum graph of the diamond film formed by using adamantane in Example 6 of the present invention.
Figure 16:
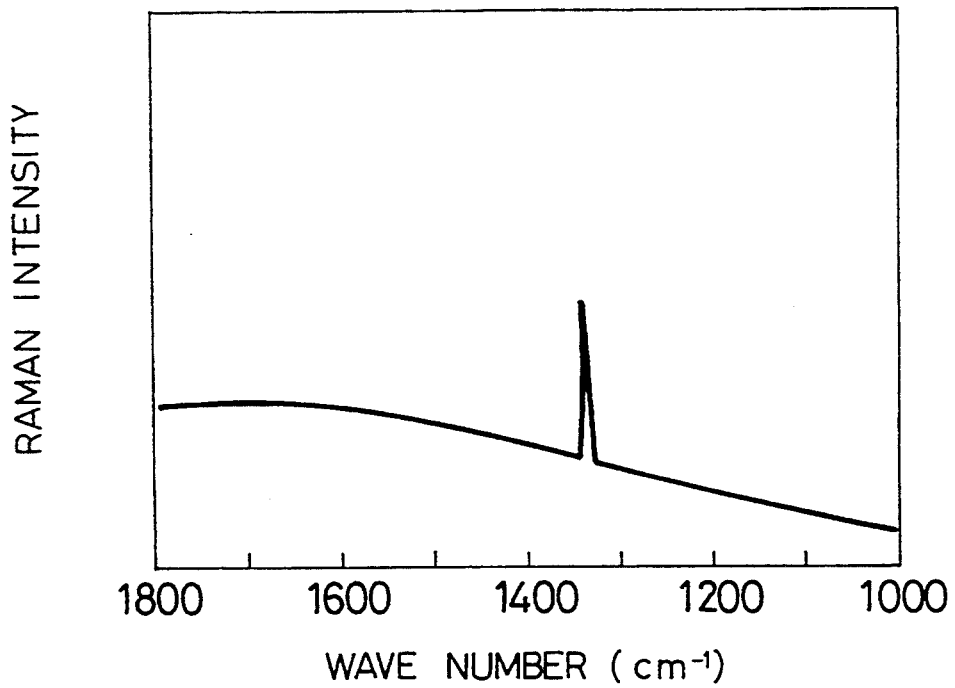
FIG. 16 is a Raman spectrum graph of the diamond film formed by heat-filament method using adamantane in Example 7 of the present invention.

FIG. 15 shows a result of a Raman spectroscopy on the center portion of φ100 mm Si wafer. There exists a sharp peak at 1332 cm$^{-1}$ showing the existence of diamond while a broad peak is seen around 1550 cm$^{-1}$ which shows the existence of amorphous carbon. It can be estimated that the deposited film was diamond which is almost the same as that obtained in Example 4.

It is concluded from Examples 4–8 that the deposition rate of diamond or diamond containing carbon can be increased more than 20 times higher than that of conventional method by the use of admantanol.

[EXAMPLE 7]

The diamond film was formed on a 10 mm×10 mm silicon substrate by thermal CVD in this example. The substrate was pretreated in advance by disposing the surface of the substrate in a liquid having diamond powders of 30–40 μm diameters using an ultrasonic vibration in order to give the surface fine scratches. The mean substrate temperature was maintained at 800° C. The filament temperature was maintained at 2000° C. by controlling the electric current passing therethrough. The substrate temperature could be controlled by setting the distance between the filament and the substrate at 8 mm. A mixture of adamantane 1 sccm and hydrogen 100 sccm was utilized as a reactive gas. The pressure was 10 Torr. For comparison, the deposition was conducted using methane 1 sccm and hydrogen 100 sccm.

The deposition rate in the case of using the mixed gas of methane and hydrogen was 0.8–0.9 μm/hour. To the contrary, the deposition rate in the case of using the mixed gas of adamantane and hydrogen was 4–5 μm/hour, which was about 5 times higher than that in the case of using the mixed gas of methane and hydrogen.

The Raman spectrum of the diamond film formed using the mixed gas of adamantane and hydrogen is shown in FIG. 18. At 1332 cm$^{-1}$ a sharp peak of diamond can be confirmed, and a peak of an amorphous diamond nearby 1550 cm$^{-1}$ is hardly noticed. It is evident that the high purity diamond film can be formed. It is also recognized by Raman spectroscopy that a diamond film can be formed even at 800°–700° C. of the substrate temperature by using adamantane as a raw material while the deposition rate tends to slow down. Also, when the temperature is less than 300° C., the proportion of non-diamond structures tends to increase in the deposited film. [EXAMPLE 8]

In this example, the diamond was formed by using a microwave plasma CVD apparatus. As a substrate, a 10 mm×10 mm silicon wafer was used. The substrate was given fine scratches on its surface by 30–40 μm diamond powders using an ultrasonic cleaner in advance of the formation of diamond. The substrate temperature was controlled with a heater and a cooling water inside the substrate support. The substrate temperature was set at approximately 700° C., which was measured by using a thermocouple located inside the substrate support and a pyrometer outside the reaction chamber. The output of microwave (2.45 GHz) was 400 W, and the reaction pressure was 400 Torr. As a reactive gas, the mixed gas of 1 sccm of adamantane and 100 sccm of hydrogen was used. The film formation was implemented without application of bias voltage to the substrate. For a comparison, the experiment using a mixed gas of 1 sccm of methane and 100 sccm of hydrogen was carried out.

The film formation speed, in case of using the mixed gas of methane and hydrogen as a reactive gas, was 0.3–0.4 μm/hour. On the other hand, the formation speed in the case of using the mixed gas of adamantane and hydrogen was 1.8–2.2 μm/hour, which was about 5 times higher than in the case of using the mixed gas of methane and hydrogen.

FIG. 17 shows the Raman spectrum of the diamond film formed, using the mixed gas of adamantane and hydrogen. A sharp peak of diamond at 1332 cm$^{-1}$ can be noticed, but a peak of an amorphous diamond nearby 1550 cm$^{-1}$ can scarcely be confirmed. Therefore, it is understood that the high purity diamond film can be formed.

It is also apparent to get 3–8 times of the film formation speed as high as that of a current method of using the mixed gas of methane and hydrogen, by means of changing such film-forming conditions as the film forming temperature, the reaction pressure, and the adamantane concentration.

[EXAMPLE 9]

In the experiment of the present invention, the diamond film was prepared by a microwave plasma CVD using a magnetic field. A $\phi$100 mm Si wafer was used as a substrate. The substrate was in advance treated to be provided with scratches on the surface, with diamond powders having 30–40 $\mu$m of particle size by using an ultrasonic washing machine. The substrate temperature was adjusted to be able to rise up to 800° C., with a heater inside a substrate support. But the minimum temperature of the substrate was dependent upon the output of microwave by which the substrate is naturally heated. The substrate temperature was measured with a thermocouple installed in the back of the substrate support, and the temperature was set at 800° C. The output of microwave (2.45 GHz) was 4 kW, and the reaction pressure was 0.3 Torr. A DC bias, in this example, 50 volt of positive electric potential was applied to the substrate. Helmholtz coils were used for inducing a magnetic field of 2 kgauss at maximum. The strength of the magnetic field in the vicinity of the substrate is about 875 gauss. As a reactive gas, the mixed gas of 50 sccm of adamantane and 100 sccm of hydrogen was used. For comparison, the experiment was conducted using a mixed gas of 50 sccm of methanol and 100 sccm of hydrogen as a reaction gas.

The deposition rate in the case of using the mixture of methane and hydrogen was 0.4 $\mu$m/hour, on the other hand, the deposition rate was 1.2–1.7 $\mu$m/hour in the case of using the mixture of adamantane and hydrogen, which is four times faster than in the case of using methane and hydrogen.

A Raman spectrum is shown in FIG. 18, which was conducted on the diamond film formed from adamantane and hydrogen. A sharp peak is seen at 1332 cm$^{-1}$ which shows the existence of diamond. Also, there is no peak observed near 1550 cm$^{-1}$ of amorphous carbon.

It is possible to obtain 3–7 times of the deposition rate as high as that of a current method using the mixed gas of methane and hydrogen, by means of changing such film-forming condition as the substrate temperature, reaction pressure, and adamantane concentration.

Also it is confirmed using the Raman spectrum that the diamond film can be formed in the range of 500°–700° C. of the substrate temperature, by using adamantane as a raw material. But the deposition rate tends to decrease as the substrate temperature decreases. Also, the constituents other than diamond tend to increase under such low temperature as less than 300° C.

The present invention should not be limited to the above particular examples and only limited to the appended claims.

What is claimed is:

1. A method of forming a diamond film or a diamond containing carbon film on a substrate comprising the steps of:
   introducing a first gas containing hydrogen, oxygen, or a mixture thereof into a plasma generating chamber maintained at a reduced pressure;
   introducing a microwave into said plasma generating chamber in order to excite said first gas;
   directing ionized or activated particles of said gas to a substrate surface placed in a reaction chamber;
   introducing a second gas containing a carbon compound whose molecules have a diamond structure to said reaction chamber; and
   depositing a diamond containing carbon film on said substrate,
   wherein said second gas is introduced in the vicinity of said substrate through an inlet port provided in a part of a substrate holder having said substrate thereon.

2. A method of forming a diamond film or a diamond containing carbon film on a substrate according to claim 1, wherein said carbon compound is a member of the group consisting of adamantane, diamantane, and triamantaneo 3. A method of forming a diamond film or a diamond containing carbon film on a substrate according to claim 1 wherein said carbon compound has a hydroxyl group (—OH).

4. A method of forming a diamond film or a diamond containing carbon film on a substrate according to claim 3, wherein the carbon compound is one of 1-adamantanol and 2-adamantanol.

5. A method according to claim 3, further comprising the step of establishing a magnetic field in said reaction chamber.

6. A method of forming a diamond film or a diamond containing carbon film on a substrate comprising the steps of:
   introducing a gas containing hydrogen, oxygen, or a mixture thereof into a plasma generating chamber maintained at a reduced pressure;
   establishing a magnetic field and introducing a microwave into said plasma generating chamber in order to excite said gas;
   directing ionized or activated particles of said gas to a substrate placed on a substrate holder in a reaction chamber;
   introducing a carbon compound gas to said reaction chamber; and
   depositing a diamond or diamond containing carbon film on said substrate,
   wherein said carbon compound is an organic material whose molecules have a diamond structure; said substrate holder carrying said substrate is rotated during the deposition; and said carbon compound gas is introduced into said reaction chamber through an inlet port provided in said substrate holder.

7. A method of forming a diamond film or a diamond containing carbon film on a substrate according to claim 6, wherein said organic material is a member of the group consisting of adamantane, diamantane, and triamantane.

8. A method of forming a diamond film or a diamond containing carbon film on a substrate according to claim 6 wherein said organic material has a hydroxyl group (—OH).

9. A method of forming a diamond film or a diamond containing carbon film on a substrate according to claim 8, wherein the organic compound is one of 1-adamantanol and 2-adamantanol.

10. A method of depositing diamond on a substrate comprising the steps of:
   inputting into a reaction chamber a reactive gas containing at least a carbon compound whose molecules have a diamond structure;
   introducing a microwave into said reaction chamber in order to excite said reactive gas; and depositing a diamond or a diamond containing carbon film on a substrate placed in said reaction chamber, wherein said carbon compound is selected from the group consisting of 1-adamantanol and 2-adamantanol and said substrate is maintained at a temperature not higher than 700° C. during depositing, and wherein said reactive gas is introduced into said reaction chamber through an inlet port provided in a part of a substrate holder having said substrate thereon.

11. A method according to claim 11 further comprising the step of establishing a magnetic field in said reaction chamber.

12. A method of depositing diamond or diamond containing carbon on a substrate comprising the steps of:

introducing a first gas containing oxygen, hydrogen, or a mixture thereof into a plasma forming chamber;

establishing a magnetic field in said plasma forming chamber;

introducing a microwave into said plasma forming chamber in order to convert said first gas to plasma in the presence of said magnetic field;

directing activated or ionized particles of said first gas from said plasma forming chamber to a deposition chamber provided adjacent to said plasma forming chamber;

inputting a second gas containing a carbon compound whose molecules have a diamond structure into said deposition chamber; and depositing diamond or a diamond containing carbon on a substrate placed in said deposition chamber, wherein said second gas is introduced into said reaction chamber through an inlet port provided in a part of a substrate holder having said substrate thereon.

13. A method according to claim 12, wherein said carbon compound is selected from the group consisting of adamantane, diamantane, triamantane, 1-adamantanol and 2-adamantanol.

14. A method of claims 1, 10 or 12, further comprising the step of applying a positive DC bias voltage to said substrate.

15. A method of forming a diamond film or a diamond containing carbon film on a substrate comprising the steps of:

introducing a gas containing hydrogen, oxygen, or a mixture thereof into a plasma generating chamber maintained at a reduced pressure;

establishing a magnetic field and introducing a microwave into said plasma generating chamber in order to excite said gas;

directing ionized or activated particles of said gas to a substrate placed on a substrate holder in a reaction chamber;

introducing a carbon compound gas comprising a carbon compound to said reaction chamber; and depositing a diamond or diamond containing carbon film on said substrate, wherein said carbon compound is an organic material whose molecules have a diamond structure and said carbon compound gas is introduced into said reaction chamber through an inlet port provided in said substrate holder.

16. The method of claim 15 wherein said substrate holder carrying said substrate is rotated during the deposition.

* * * * *